United States Patent
Sandford et al.

(10) Patent No.: US 6,362,034 B1
(45) Date of Patent: Mar. 26, 2002

(54) METHOD OF FORMING MOSFET GATE ELECTRODES HAVING REDUCED DEPLETION REGION GROWTH SENSITIVITY TO APPLIED ELECTRIC FIELD

(75) Inventors: Justin S. Sandford, Tualatin; Kaizad R. Mistry, Lake Oswego, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/471,815

(22) Filed: Dec. 20, 1999

(51) Int. Cl.[7] .................... H01L 21/336; H01L 21/8234
(52) U.S. Cl. .................. 438/197; 438/199; 438/217; 438/365; 252/204; 252/288; 252/350; 252/368
(58) Field of Search ............................... 438/199–220, 438/279–307, 365; 257/69, 204, 288, 350–68

(56) References Cited

U.S. PATENT DOCUMENTS

| | | | |
|---|---|---|---|
| 4,668,973 A | * 5/1987 | Dawson et al. | 357/54 |
| 5,089,434 A | * 2/1992 | Hollinger | 437/41 |
| 5,234,852 A | * 8/1993 | Liou | 437/44 |
| 5,393,681 A | * 2/1995 | Witek et al. | 437/40 |
| 5,428,240 A | * 6/1995 | Lur | 257/389 |
| 6,028,339 A | * 12/1998 | Frentte et al. | 257/364 |

\* cited by examiner

*Primary Examiner*—Matthew Smith
*Assistant Examiner*—Granville D. Lee, Jr.
(74) *Attorney, Agent, or Firm*—Blakely, Sokoloff, Taylor & Zafman LLP

(57) ABSTRACT

A method of fabricating a FET having a gate electrode with reduced susceptibility to the carrier depletion effect, includes increasing the amount of n-type dopant in the gate electrode of an n-channel FET. In one embodiment of the present invention, an integrated circuit including NFETs and PFETs is produced with increased n-type doping in the n-channel FET gate electrodes without the use of additional photomasking operations. Prior to polysilicon patterning, a phosphorus doped silica glass (PSG) is deposited over the polysilicon. Subsequent to patterning of the polysilicon, NFET areas are masked, and exposed PFET areas subjected to source/drain extension implant operations. During this sequence, the PSG is removed from PFET areas but remains in the NFET areas. An anneal is performed to drive the phosphorus from the PSG into the NFET gate electrodes. NFET source/drain extensions are formed, and conventional MOSFET processing operations may then be performed to complete the integrated circuit. Embodiments of the present invention achieve the desired higher levels of doping without an additional masking operation, thereby achieving the desired electrical characteristics at a lower manufacturing cost.

14 Claims, 5 Drawing Sheets

METHOD OF FORMING MOSFET GATE ELECTRODES HAVING REDUCED DEPLETION REGION GROWTH SENSITIVITY TO APPLIED ELECTRIC FIELD

BACKGROUND OF THE INVENTION

1. Field of the Invention

The present invention relates generally to semiconductor structures and manufacturing. More particularly the invention relates to the formation of polycrystalline silicon gate electrodes for metal-oxide-semiconductor field effect transistors (MOSFETs).

2. Background

Advances in semiconductor manufacturing technology have led to the integration of tens, and more recently, hundreds of millions of circuit elements, such as transistors, on a single integrated circuit (IC). In order to achieve such increases in density, not only have interconnect line widths become smaller, but so have the dimensions of metal-oxide-semiconductor field effect transistors.

MOSFETs are also sometimes referred to as insulated gate field effect transistors (IGFETs). Most commonly, these devices are referred to simply as FETS, and are so referred to in this disclosure.

Transistor scaling typically involves more than just the linear reduction of the FET width and length. For example, both source/drain (S/D) junction depth and gate insulator thickness are also typically reduced in order to produce a FET with the desired electrical characteristics.

As is well known, the gate electrode of a FET is commonly formed from a patterned layer of polycrystalline silicon. Polycrystalline silicon is also referred to as polysilicon. These polysilicon gate electrodes are commonly doped such that the gate electrodes of n-channel FETs (NFETS) are n-type, and the gate electrodes of p-channel FETs (PFETs) are p-type.

Since doped polysilicon is a semiconductor material, it tends to experience the formation of a depletion region adjacent to the interface between the gate electrode and the gate insulator (also referred to as the gate dielectric) when a voltage is applied to the gate electrode. As transistor scaling has substantially reduced the thickness of the gate insulator layer, the width of the depletion region in the doped polysilicon gate electrode has come to play a more significant role in determining the electrical characteristics of the FET. Unfortunately, the occurrence of this depletion region in the gate electrode tends to limit transistor performance.

What is needed is a gate electrode structure that substantially overcomes the problems associated with polysilicon depletion layers, and methods of making such a gate electrode structure.

SUMMARY OF THE INVENTION

Briefly, a method of fabricating a FET having a gate electrode with reduced susceptibility to the carrier depletion effect, includes increasing the amount of n-type dopant in the gate electrode of an n-channel FET.

In one embodiment of the present invention, an integrated circuit including n-channel and p-channel FETs is produced with increased n-type doping in the n-channel FET gate electrodes without the use of additional photomasking operations.

DETAILED DESCRIPTION

Figure 1:
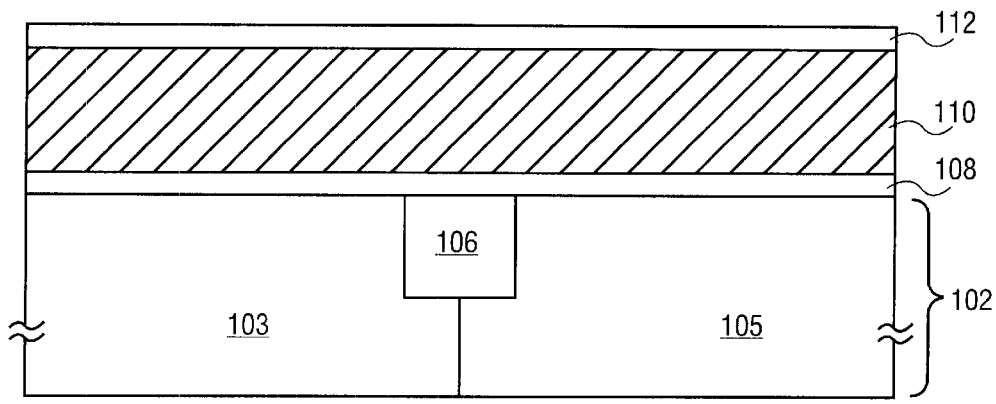
FIG. 1 is a schematic cross-sectional view of a wafer having an n-well, a p-well, a trench isolation structure, a gate dielectric layer, a polysilicon layer and phospho-silicate glass layer (PSG) formed thereon.

In conventional FETs, polysilicon is used as the gate electrode material. The polysilicon is typically doped to be p-type or n-type, using operations such as ion implantation or thermal diffusion. It has been found that polysilicon gate electrodes of FETs exhibit a carrier depletion effect that degrades or limits the electrical performance of the transistor.

The carrier depletion effect in polysilicon gate electrodes, also referred to as the poly depletion effect, occurs when an applied electric field sweeps away carriers so as to create a region in the doped polysilicon where the non-mobile dopant atoms become ionized. In n-doped polysilicon, the depletion layer includes ionized non-mobile donor sites. The poly depletion effect results in a reduction in the strength of the expected electric field at the surface of the semiconductor when a voltage is applied to the gate electrode. The reduced electric field strength adversely affects transistor performance.

The use of thinner gate insulators, will tend to make the influence of the carrier depletion effect on device degradation more pronounced. With thinner gate oxides, the polysilicon gate depletion layer will become significant in dimension when compared to the gate dielectric thickness and therefore reduce device performance. Typical depletion layer width in doped polysilicon gate electrodes is believed to be in the range of approximately 10 to 40 angstroms. The carrier depletion effect in the gate electrode limits device scalability by imposing a lower bound on how much the effective gate dielectric thickness of the FET can be reduced. In other words, the depletion layer in the gate electrode effectively moves the gate electrode further from the surface of the semiconductor and therefore makes it more difficult for the applied electric field to create an inversion layer at the surface of the semiconductor.

The size of the depletion regions is reduced as the polysilicon doping level is increased, and so one solution to this problem is to increase the doping level in the polysilicon. Unfortunately, NFET gate electrodes are typically doped during the implantation of arsenic source/drains (both source/drain extension and deep source/drain implants). The maximum dose that can be implanted during source/drain formation has some practical limits, which in turn, place constraints on the maximum polysilicon doping concentration that can be achieved merely by increasing the arsenic source/drain implant doses. Furthermore, beyond a certain dose, the solid solubility of arsenic in silicon is reached, making it difficult to achieve a higher effective doping concentration using a higher source/drain implant dose alone.

To overcome the limitations of arsenic implantation for doping the polysilicon gate electrodes of NFETs, it is possible to pre-dope the polysilicon using an extra masked implant prior to patterning the polysilicon. The advantage of an additional phosphorus implant into the polysilicon of the NFET gate electrodes is that a higher doping concentration is obtained and therefore the poly depletion effect is reduced.

Although this solution provides better transistor performance, it is more costly to manufacture because it requires an additional photomasking operation. Embodiments of the present invention achieve the desired higher levels of doping without an additional masking operation, thereby achieving the desired electrical characteristics at a lower manufacturing cost.

Terminology

The terms, chip, integrated circuit, monolithic device, semiconductor device or component, microelectronic device or component, and similar expressions, are often used interchangeably in this field. The present invention is applicable to all the above as they are generally understood in the field.

Historically, the material most commonly used in the semiconductor industry to form the gate insulator layer of a FET is silicon dioxide. Thus the gate insulator layer is frequently referred to simply as the gate oxide. The expression gate dielectric is also used to describe the gate insulator layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Poly depletion effect is an expression that is sometimes used to refer to the carrier depletion effect observed in gate electrodes formed from semiconductive materials, such as doped polysilicon.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Circuit designers often designate a particular source/drain terminal to be a "source" or a "drain" on the basis of the voltage to be applied to that terminal when the FET is operated in a circuit.

Illustrative Process Flow

Embodiments of the present invention provide a process to fabricate FETs with polysilicon gate electrodes pre-doped with phosphorus without the use of an extra masking operation.

In an illustrative embodiment of the present invention, conventional semiconductor manufacturing operations and materials common in the manufacture of CMOS integrated circuits may be used up through and including the deposition of a blanket (i.e., unpatterned) polysilicon gate electrode layer. After the formation of the polysilicon layer, a thin phosphosilicate glass (PSG) layer is deposited over the polysilicon. Subsequent to gate patterning, a masking layer is photolithographically patterned such that PFET areas are exposed and NFET areas are protected by the masking layer. The PSG layer in the PFET area is removed and a p-type implant is performed in connection with the formation of source/drain extension regions of the PFETs. The masking layer is then removed and a high temperature anneal is used to drive phosphorus from the remaining PSG into the polysilicon that will become the NFET gate electrodes. Sometimes such a high temperature operation is referred to as a drive-in operation. While this extra thermal operation does cause some diffusion of the dopants in the PFET source/drain extension, this is not believed to have a severe effect on the performance of the PFETs because the additional diffusion does not substantially affect the steepness of the source/drain extension profile. NFET source/drain extensions are implanted, the PSG layer is removed, and conventional operations may be used to complete the fabrication of the CMOS integrated circuit.

Alternatively, the PSG layer may be removed prior to the source/drain extension implant. In this way, the polysilicon receives the n-type dopants from the source/drain extension implant without interference from the overlying PSG layer.

Figure 4:
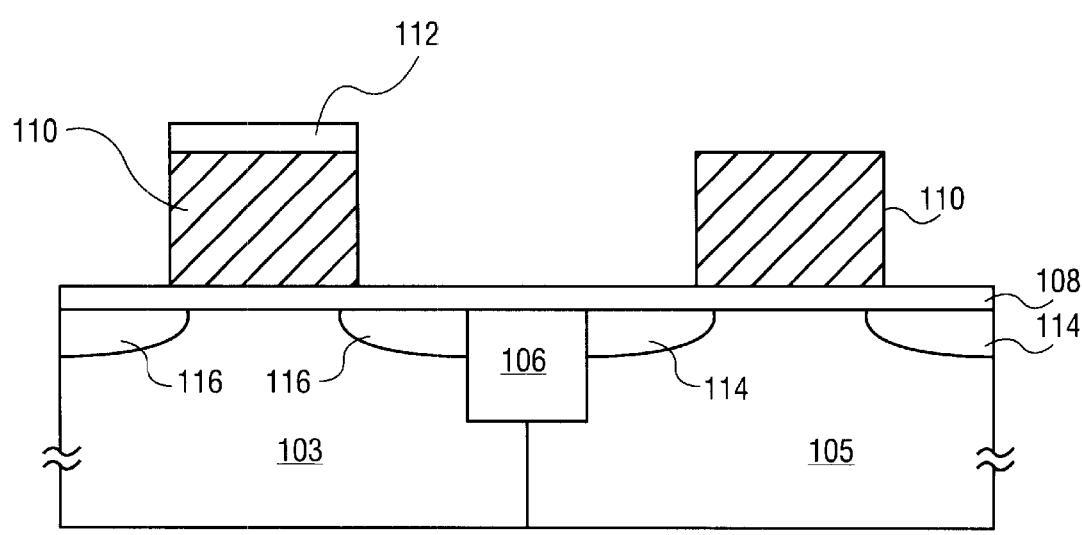
FIG. 4 is a schematic cross-sectional view of the structure of FIG. 3, after the masking layer over the NFET area has been removed, phosphorus from the PSG has been driven into the NFET gate electrode, and NFET source/drain extensions have been implanted.
Figure 5:
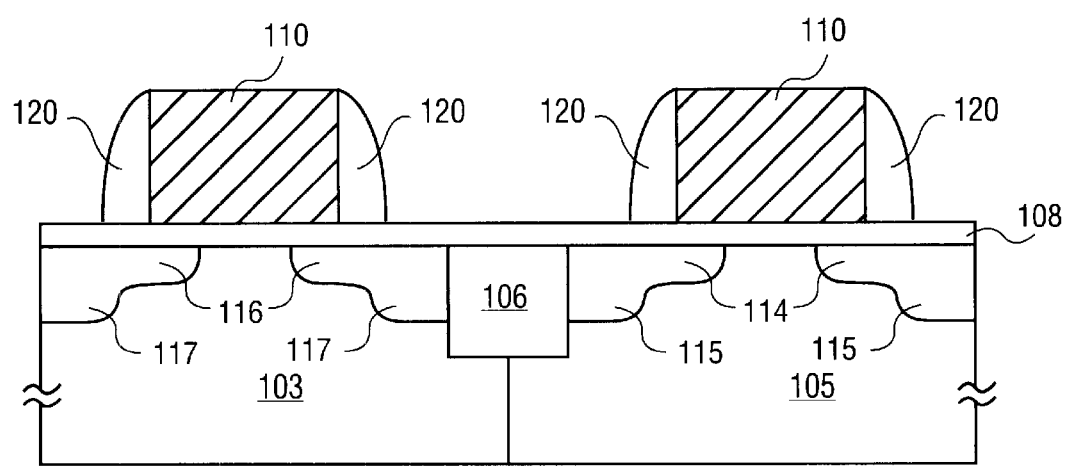
FIG. 5 is a schematic cross-sectional view of the structure of FIG. 4, after conventional processing operations are performed to complete NFET and PFET structures.
Figure 6:
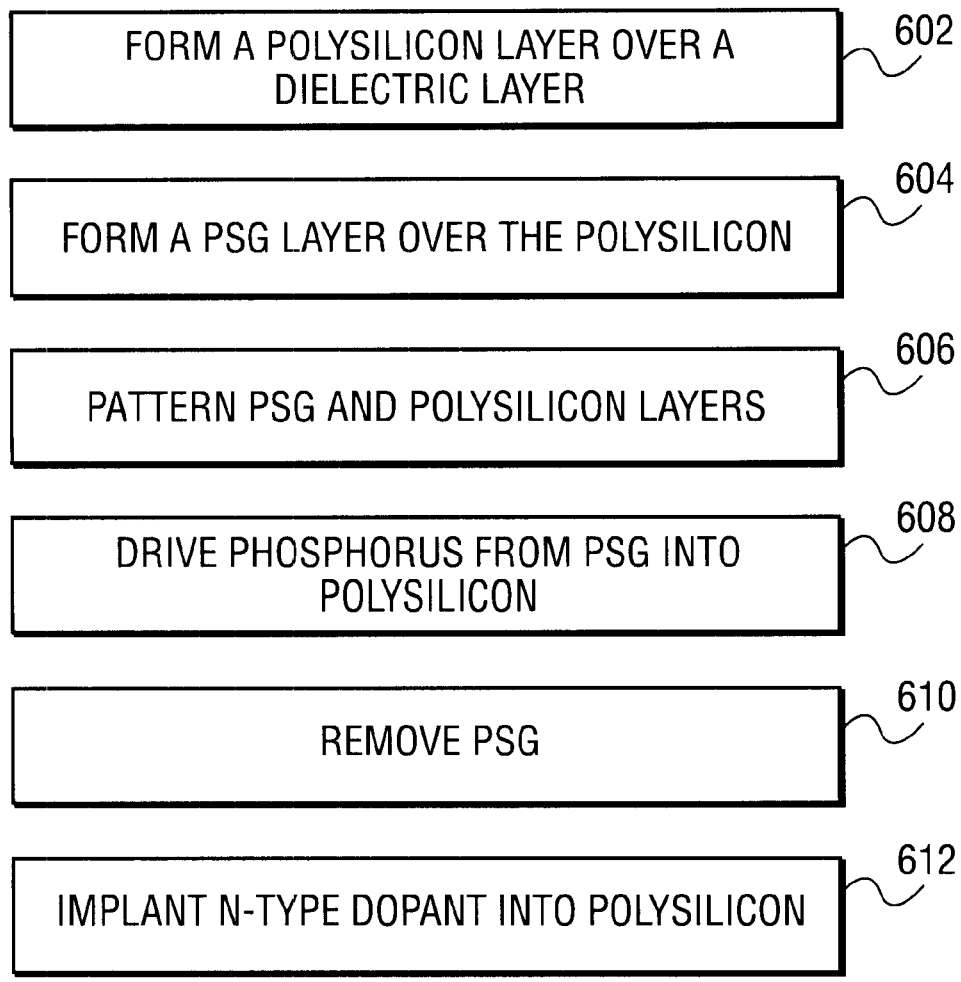
FIG. 6 is a flow diagram of a process in accordance with the present invention.
Figure 7:
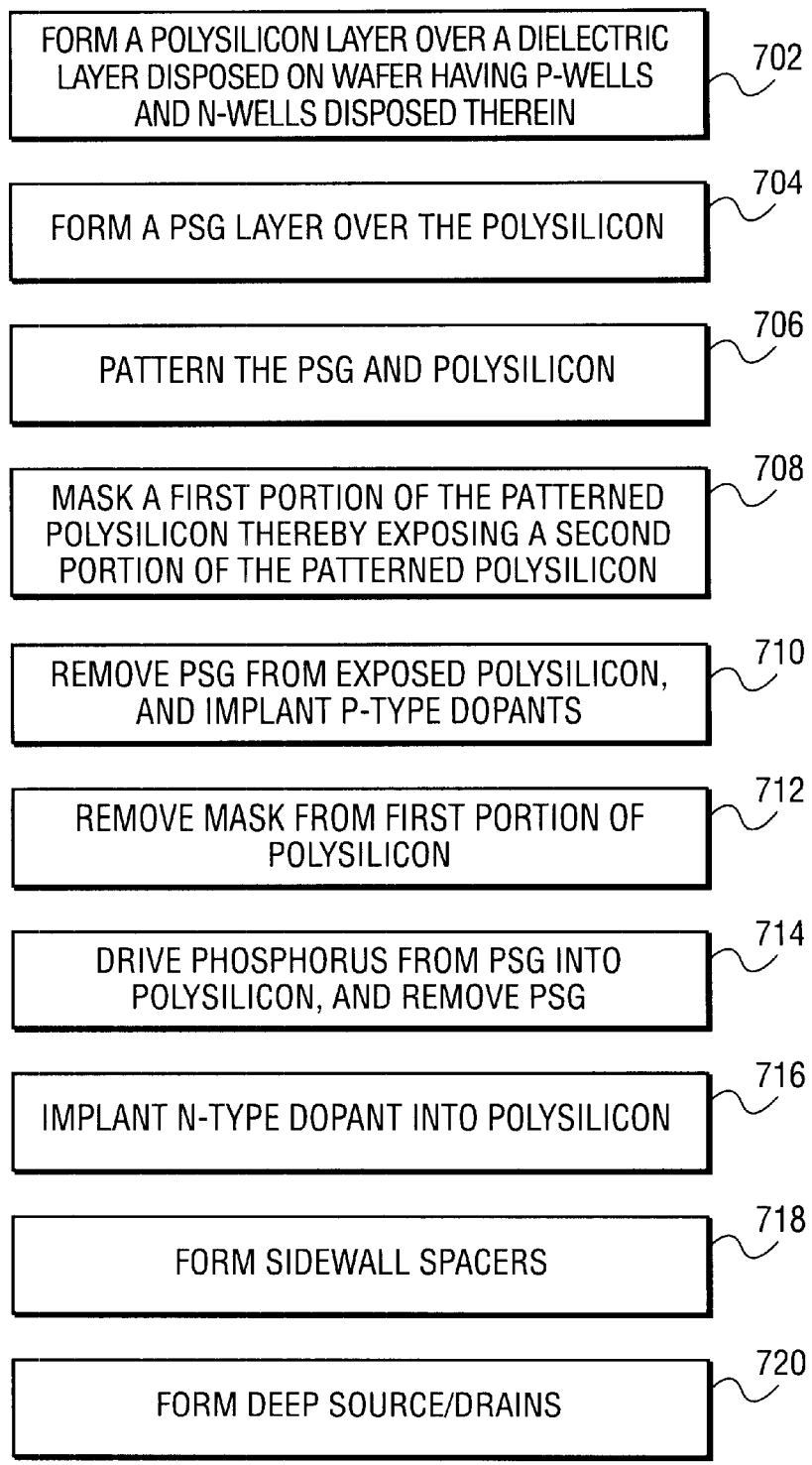
FIG. 7 is a flow diagram of a process in accordance with the present invention.

Illustrative embodiments of the present invention are described in conjunction with FIGS. 1–7. The structures obtained via various processing operations are shown in FIGS. 1–5. Flow diagrams are presented in FIGS. 6–7 showing processes that enable, respectively, the fabrication of doped polysilicon, and NFET gate electrodes in a CMOS integrated circuit, where those gate electrodes receive n-type doping, without an additional masking operation, in addition to what is received during source/drain implants. Those skilled in this field and having the benefit of this disclosure will recognize that for deep submicron transistors, source/drain implants typically include a first, or source/drain extension, implant at a first dose and energy, and a second, or deep source/drain implant, at a second dose and energy. These implant doses and energies are selected in accordance with dimensions and electrical properties desired by a particular manufacturer.

To form an integrated circuit containing both NFETs and PFETs in accordance with the present invention, conventional, semiconductor processing operations are performed upon a wafer up through the formation of the unpatterned polysilicon gate electrode layer. Referring to FIG. 1, a cross-sectional view of a partially fabricated integrated circuit is shown. A wafer 102 has a p-well region 103, an n-well region 105, and a trench isolation structure 106 formed therein. Those skilled in the art will recognize that the wells and trench isolation structure may be formed by any of the well known methods available for their formation. A gate dielectric layer 108 is formed over a surface of wafer 102. Typically, the gate dielectric layer is an oxide of silicon, but any material suitable for use as a gate dielectric may be used. Examples of other gate dielectric materials include silicon nitride and silicon oxynitride. A polysilicon layer 110 is then deposited over gate dielectric layer 108. In accordance with the present invention, a layer of phosphosilicate glass (PSG) 112 is deposited over polysilicon 110. PSG 112 typically has a phosphorous content in the range of 1% to 6%.

Figure 2:
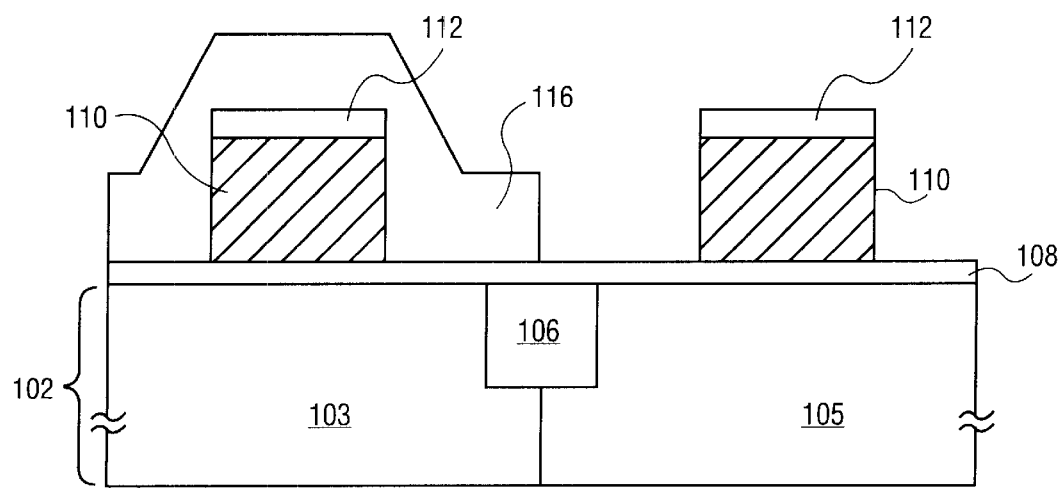
FIG. 2 is a schematic cross-sectional view of the structure of FIG. 1, after processing operations in which the PSG and polysilicon layers have been patterned, and a masking layer formed over the NFET area.

FIG. 2, shows the structure of FIG. 1, after additional processing operations are performed. PSG 112 and polysilicon 110 are photolithographically patterned according to a FET gate mask. After patterning of PSG 112 and polysilicon 110, a masking layer 116 is formed over the NFET regions of the wafer. Those skilled in the art will recognize that although the exact dimensions of masking layer 116 may vary, those dimensions should preferably be such that at least the portions of wafer 102 in which NFETs will reside are protected from various p-type implants performed on the PFET structures, and further protected from the removal of PSG layer 112. Masking layer 116 may be a conventional photoresist material which is applied and patterned in accordance with conventional, well known methods.

Figure 3:
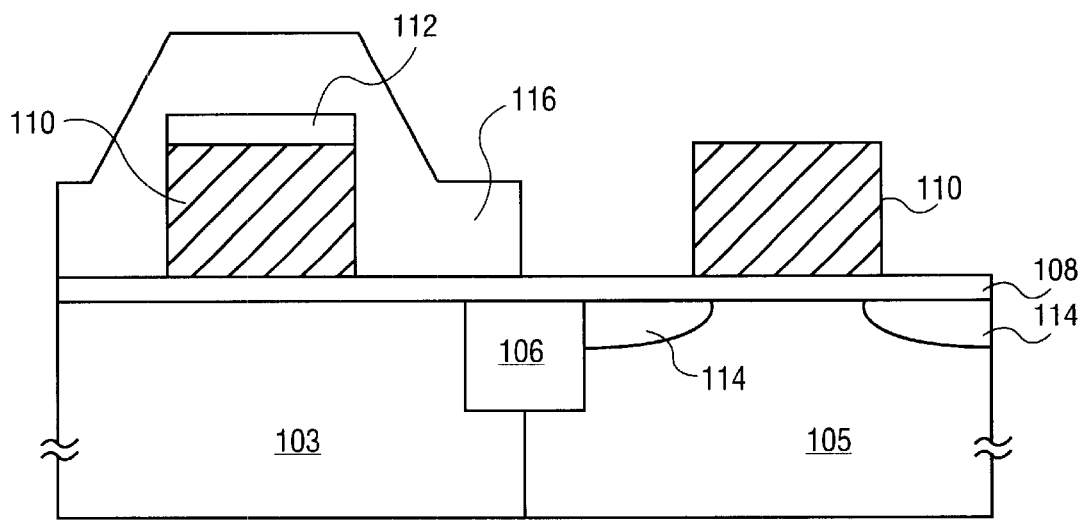
FIG. 3 is a schematic cross-sectional view of the structure of FIG. 2, after the PSG layer has been removed from the PFET gate electrode and PFET source/drain extensions have been implanted.

As shown in FIG. 3, subsequent to the formation of masking layer 116, PSG 112 is removed where it overlies polysilicon 110 in the PFET regions. As is further shown in FIG. 3, subsequent to the removal of PSG 112, formation of source/drain extensions 114 is completed by p-type ion implantation.

FIG. 4 shows the structure of FIG. 3, after masking layer 116 is removed, n-type source/drain extensions 116 are implanted self-aligned to laterally opposed sides of polysilicon 110, which forms the NFET gate electrodes, and a high temperature anneal is performed to drive phosphorus from PSG 112 into the polysilicon 110 which makes up the NFET gate electrode. In one embodiment of the present invention, the high temperature anneal is a rapid thermal anneal (RTA) operation. Such an RTA operation may be performed at a temperature in the range of approximately 950° C. to 1050° C. for a time in the range of approximately 1 second to 100 seconds. Those skilled in the art will appreciate that a masking operation (not shown) is typically performed to mask, i.e., protect, the PFET regions from the n-type source/drain extension implant.

FIG. 5 shows the completed NFET and PFET structures obtained from the structure of FIG. 4, after additional conventional processing operations such as the formation of sidewall spacers 120 on the gate electrodes, and formation, typically by ion implantation, of deep source/drains 115 for the PFET, and deep source/drains 117for the NFET.

Various other layers of insulators and conducting material are typically formed above the transistor level, as is well understood in the field of semiconductor manufacturing and integrated circuit design. In this way, various circuit elements may be interconnected so as to provide the desired electrical functionality.

Referring to FIG. 6, a process embodying the present invention is described. In this illustrative example, doped polysilicon is formed with both implanted and thermally diffused dopants. More particularly, a polysilicon layer is formed over a dielectric layer (block 602). Typically, the dielectric layer is an oxide of silicon formed on the surface of a silicon wafer. Deposition of polysilicon layers is very well known in the semiconductor industry and is not further described herein. A PSG layer is then formed over the polysilicon layer (block 604). The PSG and polysilicon layers are then patterned (block 606). Patterning is accomplished by well-known photolithographic techniques of masking and etching. The structure is then heated to a high temperature in order to drive at least some of the phosphorus from the PSG into the polysilicon (block 608). The PSG layer is then removed (block 610) by etching, and n-type dopants, for example arsenic, are implanted (block 612) into the polysilicon which already contains phosphorus dopants. In this way, polysilicon may be doped n-type to a greater concentration than is possible with an n-type implant alone which may be constrained in dose and energy.

Referring to FIG. 7, another process embodying the present invention is described. In this illustrative example, NFETs and PFETs are formed with the NFETs receiving an additional thermally diffused dose of n-type dopants without the need for an additional masking operation. More particularly, a polysilicon layer is formed over a dielectric layer (block 702). Typically, the dielectric layer is an oxide of silicon formed on the surface of a silicon wafer. The wafer in this example, has p-well and n-well regions formed therein. As will be recognized by those skilled in the art, NFETs are formed in the p-well regions of the wafer, and is PFETs are formed in the n-well regions of the wafer. A PSG layer is then formed over the polysilicon layer (block 704). The PSG and polysilicon layers are then patterned (block 706). A masking layer is formed over the patterned PSG and polysilicon and then patterned such that a first portion of the patterned PSG and polysilicon are protected by the masking layer, and a second portion of the patterned PSG and polysilicon are exposed (block 708). The exposed PSG is then removed, and p-type dopants are implanted self-aligned to the exposed polysilicon (block 710). In this way p-type source/drain extensions are formed. The masking layer is then removed (block 712). The structure is then heated to a high temperature in order to drive at least some of the phosphorus from the PSG into the polysilicon, and then the remaining PSG is removed (block 714). N-type dopants, for example arsenic, are implanted (block 716) into the polysilicon of the first portion, which already contains phosphorus dopants. In this way, polysilicon may be doped n-type to a greater concentration than is possible with an n-type implant alone which may be constrained in dose and energy. Sidewall spacers are formed along laterally opposing sides of the patterned polysilicon (block 718). Formation of sidewall spacers for MOSFETs is well-known in this field. These spacers may be formed from of single material, such as silicon nitride, or multi-layer combinations of materials such as silicon dioxide and silicon nitride. The present invention is not limited to any particular material, thickness, or structure in the implementation of sidewall spacers. After sidewall spacer formation, the n-type deep source/drain implants are performed with the PFET regions masked (block 720). In this way, the NFET gate electrodes are more heavily doped than is possible with the source/drain implants alone. Similarly, the NFET regions are masked, and the p-type deep source/drain implant is performed. In this way, a process for the manufacture of integrated circuits containing NFETs and PFETs is provided.

Those skilled in the art and having the benefit of this disclosure will appreciate that the present invention is not limited in use to the structure illustrated in FIG. 5. For example, structural elements including, but not limited to, multiple layer sidewall spacers, silicided source/drain terminals, silicided gate electrode, and shallow isolation trenches, may or may not be used in MOSFETs of the present invention.

Conclusion

An advantage of embodiments of the present invention is the substantial reduction, or elimination of transistor performance limitations caused by carrier depletion in conventional polysilicon gate electrodes.

A further advantage of the present invention is that NFET gate electrodes can be provided with additional thermally diffused n-type dopants without an additional masking operation.

The present invention may be implemented with various changes and substitutions to the illustrated embodiments. For example although silicon wafers have been discussed, other substrates may be used.

It will be readily understood by those skilled in the art and having the benefit of this disclosure, that various other changes in the details, materials, and arrangements of the materials or order of operations which have been described and illustrated in order to explain the nature of this invention may be made without departing from the principles and scope of the invention as expressed in the subjoined Claims.

What is claimed is:

1. A method of making transistors, comprising:

depositing a PSG layer over a polysilicon layer;

patterning the PSG and polysilicon layers to form a plurality of gate electrodes covered with PSG;

patterning a masking layer such that a first portion of the gate electrodes are covered by the masking layer and a second portion of the gate electrodes are uncovered;

removing the PSG from the second portion of gate electrodes;

implanting p-type dopants into the exposed gate electrodes;

removing the masking layer and driving phosphorus from the PSG into the polysilicon;

removing the PSG from the first portion of gate electrodes; and implanting first n-type dopants into the first portion of gate electrodes.

2. The method of claim 1, wherein the polysilicon layer is formed over a dielectric layer that is formed on a wafer.

3. The method of claim 2, wherein the dielectric layer comprises an oxide of silicon and the wafer comprises silicon.

4. The method of claim 1, wherein implanting first n-type dopants comprises implanting arsenic at a dose and energy necessary for the formation of source/drain extensions.

5. The method of claim 4, further comprising implanting arsenic at a dose and energy sufficient for the formation of deep source/drain regions.

6. The method of claim 1, further comprising forming sidewall spacers adjacent to laterally opposed sides of the gate electrodes.

7. The method of claim 6, further comprising implanting second n-type dopants at a higher dose and energy than that used for first n-type implant.

8. The method of claim 1, wherein PSG has a phosphorus content of in the range of 1% to 6%.

9. A method of forming a microelectronic device, comprising:

forming a PSG layer over a polysilicon layer;

performing a high temperature drive-in;

removing the PSG layer; and implanting an n-type dopant into the polysilicon;

wherein the polysilicon layer overlies a dielectric layer disposed on a substrate.

10. The method of claim 9, wherein implanting an n-type dopant into the polysilicon comprises implanting arsenic at a first dose and a first energy; and implanting arsenic at a second dose and a second energy.

11. The method of claim 9, wherein performing a high temperature drive-in comprises a rapid thermal anneal at a temperature in the range of 950° C. to 1050° C., for a length of time in the range of 1 second to 100 seconds.

12. The method of claim 10, further comprising patterning the PSG and polysilicon prior to performing the high temperature drive-in.

13. The method of claim 12, further comprising forming source/drain terminals in the substrate adjacent to the patterned polysilicon.

14. The method of claim 12, further comprising, concurrently with implanting the polysilicon, implanting portions of the substrate to form source and drain regions.

* * * * *